US011322465B2

(12) United States Patent
Holland et al.

(10) Patent No.: US 11,322,465 B2
(45) Date of Patent: May 3, 2022

(54) METAL LAYER PATTERNING FOR MINIMIZING MECHANICAL STRESS IN INTEGRATED CIRCUIT PACKAGES

(71) Applicant: Cirrus Logic International Semiconductor Ltd., Edinburgh (GB)

(72) Inventors: Kathryn R. Holland, Austin, TX (US); Marc L. Tarabbia, Austin, TX (US); Yaoyu Pang, Austin, TX (US); Alexander Barr, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/897,036

(22) Filed: Jun. 9, 2020

(65) Prior Publication Data
US 2021/0066221 A1   Mar. 4, 2021

Related U.S. Application Data

(60) Provisional application No. 62/891,566, filed on Aug. 26, 2019.

(51) Int. Cl.
*H01L 23/00* (2006.01)
(52) U.S. Cl.
CPC .............. *H01L 24/05* (2013.01); *H01L 24/03* (2013.01); *H01L 24/13* (2013.01); *H01L 2224/0401* (2013.01); *H01L 2224/05015* (2013.01); *H01L 2224/05124* (2013.01); *H01L 2224/05147* (2013.01); *H01L 2224/13026* (2013.01); *H01L 2924/351* (2013.01)
(58) Field of Classification Search
CPC ......... H01L 24/05; H01L 24/03; H01L 24/13; H01L 2224/0401; H01L 2224/05015; H01L 2224/05124; H01L 2224/05147; H01L 2224/13026; H01L 2924/351
See application file for complete search history.

(56) References Cited

U.S. PATENT DOCUMENTS

| 6,118,180 A | 9/2000 | Loo et al. |
| 9,922,896 B1 * | 3/2018 | Cheng .................... H01L 24/05 |
| 2007/0290343 A1 | 12/2007 | Harada et al. |

(Continued)

FOREIGN PATENT DOCUMENTS

TW         201711111 A         3/2017

OTHER PUBLICATIONS

International Search Report and Written Opinion of the International Searching Authority, International Application No. PCT/US2020/046153, dated Nov. 26, 2020.

*Primary Examiner* — Douglas W Owens
(74) *Attorney, Agent, or Firm* — Jackson Walker L.L.P.

(57) ABSTRACT

A method may include forming a metal pattern in a metal layer of a fabricated integrated circuit device and under a target bump of the fabricated integrated circuit device, wherein the metal pattern has an inner shape and an outer field such that a void space in the metal layer is created between the inner shape and the outer field and approximately centering the void space on an outline of an under-bump metal formed under the target bump with a keepout distance from the inner shape and the outer field on either side of the outline such that the metal minimizes local variations in mechanical stress on underlying structures within the fabricated integrated circuit device.

36 Claims, 4 Drawing Sheets

(56) References Cited

U.S. PATENT DOCUMENTS

| | | | |
|---|---|---|---|
| 2010/0193945 A1* | 8/2010 | Hochstenbach | H01L 23/53295 |
| | | | 257/737 |
| 2010/0230811 A1* | 9/2010 | Shin | H01L 23/3192 |
| | | | 257/737 |
| 2010/0252926 A1* | 10/2010 | Kato | H01L 24/13 |
| | | | 257/738 |
| 2013/0119534 A1 | 5/2013 | Daubenspeck et al. | |
| 2015/0214168 A1* | 7/2015 | Chang | H05K 3/3457 |
| | | | 257/773 |
| 2016/0322455 A1* | 11/2016 | Woodford | H01L 29/0657 |

\* cited by examiner

METAL LAYER PATTERNING FOR MINIMIZING MECHANICAL STRESS IN INTEGRATED CIRCUIT PACKAGES

RELATED APPLICATION

The present disclosure claims priority to U.S. Provisional Patent Application Ser. No. 62/891,566, filed Aug. 26, 2019, which is incorporated by reference herein in its entirety.

FIELD OF DISCLOSURE

The present disclosure relates in general to semiconductor fabrication, and more particularly, to patterning of a top-level metal layer in order to minimize or eliminate mechanical stresses in integrated circuit packages, including wafer-level chip-scale packages.

BACKGROUND

Semiconductor device fabrication is a process used to create integrated circuits that are present in many electrical and electronic devices. Semiconductor device fabrication comprises a multiple-step sequence of photolithographic, mechanical, and chemical processing steps during which electronic circuits are gradually created on a wafer made of semiconducting material. For example, during semiconductor device fabrication, numerous discrete circuit components, including transistors, resistors, capacitors, inductors, and diodes, may be formed on a single semiconductor die.

Increasingly, integrated circuits formed on semiconductors are often packaged as wafer-level chip-scale packages (WLCSPs). Generally speaking, fabrication of a WLCSP involves packaging an integrated circuit while the integrated circuit is still part of a semiconductor wafer, in contrast to the more conventional method of slicing the wafer into individual circuits (dice) and then packaging the dice individually. Thus, the resulting package may be practically of the same size as the die. A major application area of WLCSPs are smartphones and similar mobile devices due to size constraints of such devices. For example, functions provided by WLCSPs in smartphones may include sensors, power management, wireless communication, amplifiers, and others.

In forming a WLCSP, integrated circuit devices may be patterned on a bottom layer formed in the semiconductor, followed by multiple metal routing layers (e.g., copper), then followed by a top-level routing metal (e.g., aluminum). Over the top-level routing metal, a WLCSP may include a metal redistribution layer (e.g., copper or a copper alloy) that may be in contact with an under-bump metal (e.g., copper or a copper alloy), that is in turn in contact with a solder bump. Attaching the integrated circuit die to a substrate (e.g., a printed circuit board substrate) may be accomplished by melting the various solder bumps of the die to corresponding metal pad landings on the substrate and then allowing both to cool.

Due to mismatch of the mechanical and/or thermal properties of the WLCSP chip (as packaged) and the substrate, the process of soldering the chip to the substrate, cooling, and/or temperature cycling after attachment of the die to the substrate may cause mechanical stresses (e.g., tension and/or compression) on the underlying silicon structures. Such mechanical stresses may affect electrical characteristics of the integrated circuit, potentially resulting in an integrated circuit having significantly different electrical characteristics than those tested and characterized prior to attachment of the WLCSP die to the substrate.

SUMMARY

In accordance with the teachings of the present disclosure, certain disadvantages and problems associated with fabrication of passive electrical components in an integrated circuit may be reduced or eliminated.

In accordance with embodiments of the present disclosure, a method may include forming a metal pattern in a metal layer of a fabricated integrated circuit device and under a target bump of the fabricated integrated circuit device, wherein the metal pattern has an inner shape and an outer field such that a void space in the metal layer is created between the inner shape and the outer field, and approximately centering the void space on an outline of an under-bump metal formed under the target bump with a keepout distance from the inner shape and the outer field on either side of the outline such that the metal minimizes local variations in mechanical stress on underlying structures within the fabricated integrated circuit device.

In accordance with these and other embodiments of the present disclosure, a fabricated integrated circuit device may comprise a metal pattern formed in a metal layer of the fabricated integrated circuit device and under a target bump of the fabricated integrated circuit device, wherein: the metal pattern has an inner shape and an outer field such that a void space in the metal layer is created between the inner shape and the outer field; and the void space is approximately centered on an outline of an under-bump metal formed under the target bump with a keepout distance from the inner shape and the outer field on either side of the outline such that the metal minimizes local variations in mechanical stress on underlying structures within the fabricated integrated circuit device.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
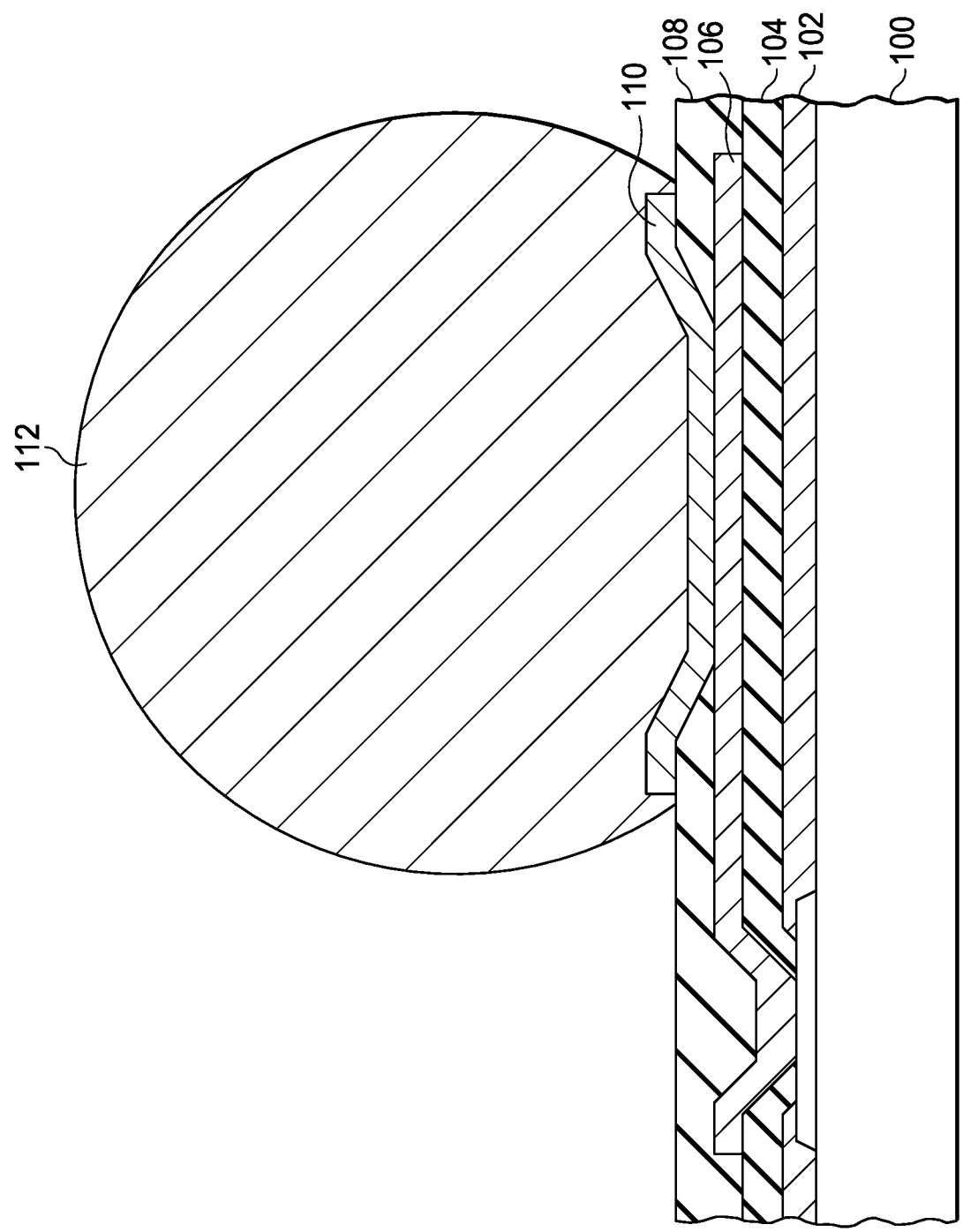
FIG. 1 illustrates a side cross-sectional elevation view of a portion of a semiconductor substrate with an integrated circuit patterned therein, in accordance with embodiments of the present disclosure.

FIG. 1 illustrates a side cross-sectional elevation view of a portion of a semiconductor substrate 100 with an integrated circuit 102 patterned therein, in accordance with embodiments of the present disclosure. Semiconductor substrate 100 may be formed of any suitable material including without limitation silicon, silicon carbide, germanium, gallium phosphide, gallium nitride, gallium arsenide, indium phosphide, indium nitride, indium arsenide, etc. Although not explicitly shown in FIG. 1, numerous devices (e.g., transistors, resistors, etc.) may be formed within semiconductor substrate 100 to create integrated circuit 102. Integrated circuit 102 may also include multiple metal routing layers (e.g., a plurality of copper layers, not explicitly shown in FIG. 1). Over such integrated circuit 102 may be formed (e.g., using known techniques) an electrically-insulative layer 104, patterned with openings to allow a top metallization layer 106 (e.g., a metal redistribution layer comprising, for example, copper or a copper alloy) to itself be formed over electrically-insulative layer 104 and patterned to provide desired electrical connectivity between bumps 112 formed on semiconductor substrate 100 and the integrated circuit 102 formed below. Another electrically-insulative layer 108 may be formed (e.g., using known techniques) over top metallization layer 106 and itself patterned with openings to allow top metallization layer 106 to provide desired electrical connectivity between top metallization layer 106 and under-bump metal 110 (e.g., copper or a copper alloy) formed and interfaced between top metallization layer 106 and bumps 112. Bumps 112 may be formed from solder or any other suitable electrically-conductive material also having desired thermal properties (e.g., a melting point) that allow attachment of bumps 112 and the "stack-up" depicted in FIG. 1 to be accomplished by melting bumps 112 to corresponding metal pad landings on a substrate (e.g., a printed circuit board substrate) and then allowing bumps 112 to cool and return to solid phase.

Figure 2:
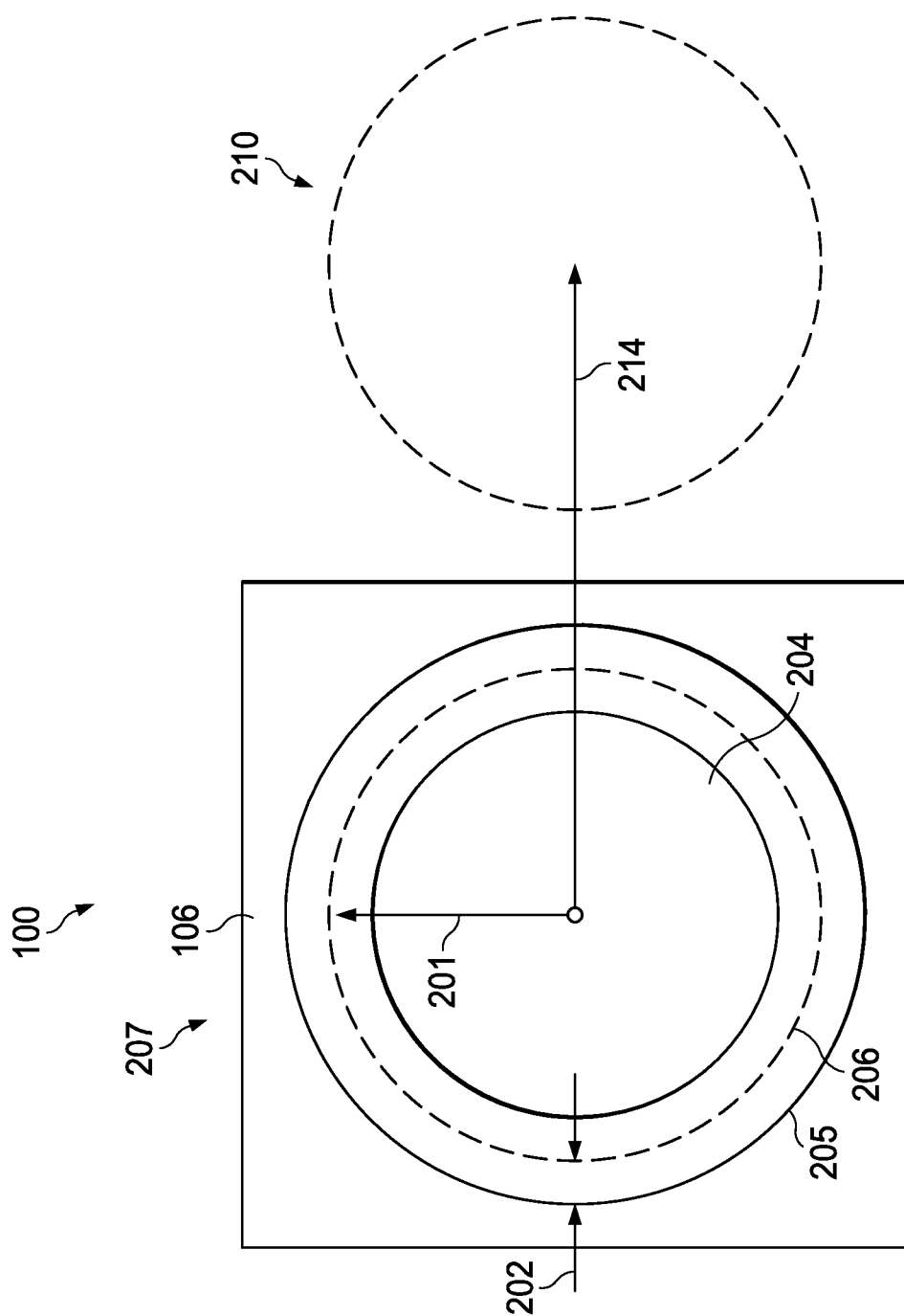
FIG. 2 illustrates a top plan view of a portion of a semiconductor substrate depicting an example patterning of a metal layer for minimizing mechanical stress in an integrated circuit package comprising the semiconductor substrate, in accordance with embodiments of the present disclosure.

FIG. 2 illustrates a top plan view of a portion of semiconductor substrate 100 depicting an example patterning of top metallization layer 106 for minimizing mechanical stress in an integrated circuit package comprising the semiconductor substrate 100, in accordance with embodiments of the present disclosure. As shown in FIG. 2, patterns/shapes may be formed in top metallization layer 106 of a target bump landing 207 proximate to under-bump metal 110 (and consequently, formed in top metallization layer 106 proximate to a bump 112) in order to localize mechanical stress to the region of under-bump metal outline 206 (e.g., a footprint of under-bump metal 110) depicted in FIG. 2, which may minimize or eliminate local variations in mechanical stress on underlying structures in semiconductor substrate 100.

Such patterning of top metallization layer 106 may include an inner shape 204 which may comprise a circle or an n-sided polygon. In some embodiments, inner shape 204 may include a polygon with a number of sides (e.g., eight or more) such that such polygon approximates a circle. Such patterning of top metallization layer 106 may also include an outer field 203 separated from inner shape 204 by a void space 205 formed in top metallization layer 106. Void space 205 may be approximately centered (e.g., centered within fabrication tolerances and resolution) at a distance 201 from a center of inner shape 204 on under-bump metal outline 206, without a keepout distance 202 on either side of under-bump metal outline 206. Keepout distance 202 may be of any suitable distance, such that it does not encroach on non-target bumps 210 having a bump pitch 214 from target bump landing 207. Outer field 203 may have an arbitrary outer edge but may maintain keepout distance 202 from under-bump metal outline 206.

Although FIG. 2 depicts a particular pattern, other suitable patterning may be used in accordance with this disclosure.

Figure 3C:
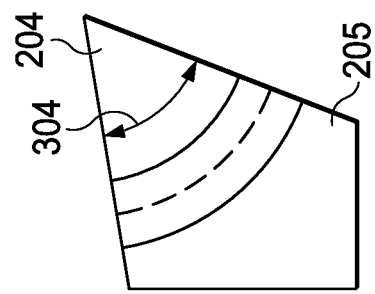
FIG. 3C illustrates a top plan view of a portion of a semiconductor substrate depicting an example patterning of a metal layer with angle segments for minimizing mechanical stress in an integrated circuit package comprising the semiconductor substrate, in accordance with embodiments of the present disclosure.
Figure 3B:
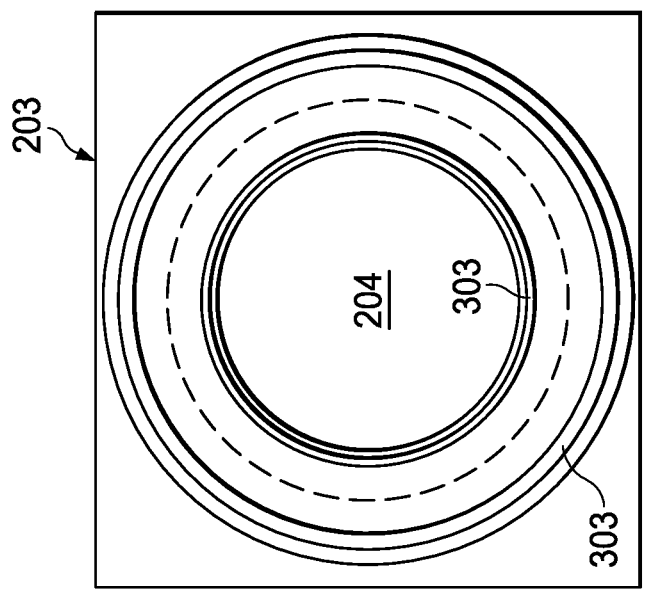
FIG. 3B illustrates a top plan view of a portion of a semiconductor substrate depicting an example patterning of a metal layer with a plurality of co-centered rings for minimizing mechanical stress in an integrated circuit package comprising the semiconductor substrate, in accordance with embodiments of the present disclosure.
Figure 3A:
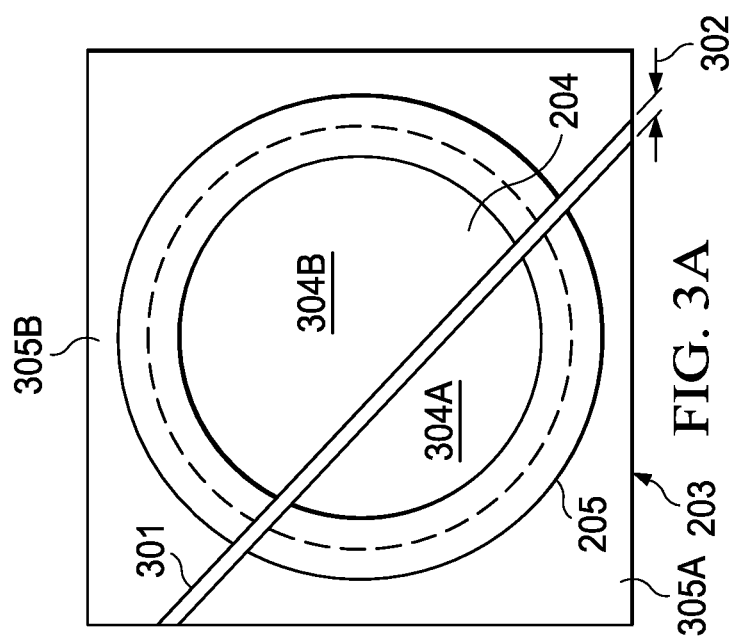
FIG. 3A illustrates a top plan view of a portion of a semiconductor substrate depicting an example patterning of a metal layer with a gap for minimizing mechanical stress in an integrated circuit package comprising the semiconductor substrate, in accordance with embodiments of the present disclosure.

For example, FIG. 3A illustrates a top plan view of a portion of semiconductor substrate 100 depicting an example patterning of a metallization layer (e.g., top metallization layer 106) with a linear lateral gap 301 having a gap distance 302, in accordance with embodiments of the present disclosure. In such an embodiment, a metal pattern may maintain the same overall profile, including keepout distance 202, as shown and described with respect to FIG. 2 above. The patterning shown in FIG. 3A may be useful where different features of the metal pattern are electrically coupled to different electrical networks (e.g., portion 304A of inner shape 204 may be coupled to a different electrical network than that of portion 304B of inner shape 204, portion 305A of outer field 203 may be coupled to a different electrical network than that of portion 305B of outer field 203).

As another example, FIG. 3B illustrates a top plan view of a portion of a semiconductor substrate 100 depicting an example patterning of a metallization layer (e.g., top metallization layer 106) with a plurality of minor co-centered rings 303, in accordance with embodiments of the present disclosure. Each co-centered ring 303 may comprise a circle or an n-sided polygon. In some embodiments, each co-centered ring 303 may include a polygon with a number of sides (e.g., eight or more) such that such polygon approximates a circle. As depicted in FIG. 3B, each co-centered ring 303 may have approximately (e.g., within fabrication tolerances and resolution) the same center as each other, and/or may have approximately (e.g., within fabrication tolerances and resolution) the same center as inner shape 204. The use of minor co-centered rings 303 as shown in FIG. 3B may create a gradient in the metallization, which may further enhance the mechanical stress minimization properties of the patterning.

As a further example, FIG. 3C illustrates a top plan view of a portion of a semiconductor substrate 100 depicting an example patterning of a metallization layer (e.g., top metallization layer 106) with an angle segment 304, in accordance with embodiments of the present disclosure. In such an embodiment, a metal pattern may maintain the same overall profile, including keepout distance 202, as shown and described with respect to FIG. 2 above, but with only one or more portions, as defined by one or more angle segments 304, each having an angle between zero and 360 degrees, present within such profile. The patterning shown in FIG. 3C may be useful where different features of the metal pattern are electrically coupled to different electrical networks.

Figure 3D:
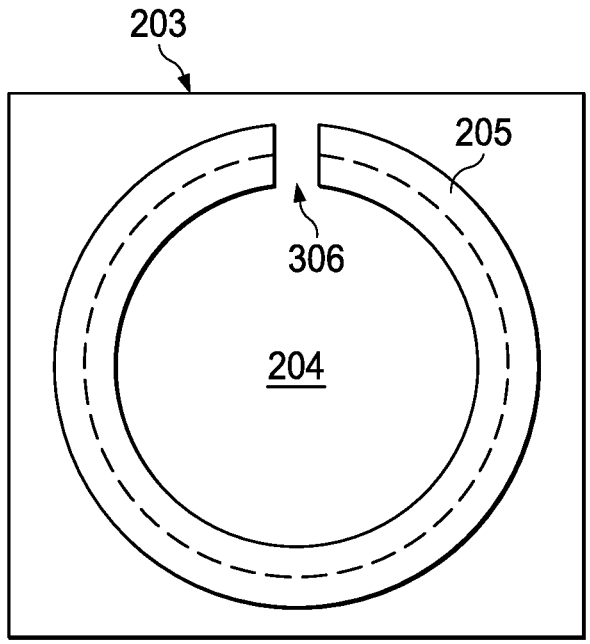
FIG. 3D illustrates a top plan view of a portion of a semiconductor substrate depicting an example patterning of a metal layer for minimizing mechanical stress in an integrated circuit package comprising the semiconductor substrate, the patterning including a bridge between an inner shape and an outer field, in accordance with embodiments of the present disclosure.

FIG. 3D illustrates a top plan view of a portion of a semiconductor substrate 100 depicting an example patterning of a metallization layer (e.g., top metallization layer 106), the patterning including a bridge 306 between inner shape 204 and outer field 203, in accordance with embodiments of the present disclosure. In such an embodiment, a metal pattern may maintain the same overall profile, including keepout distance 202, as shown and described with respect to FIG. 2 above. The patterning shown in FIG. 3D may be useful where different features of the metal pattern are electrically coupled to the same electrical networks (e.g., bridge 306 electrically couples together inner shape 204 and outer field 203 such that inner shape 204 and outer field 203 are of the same electrical node).

Figure 3E:
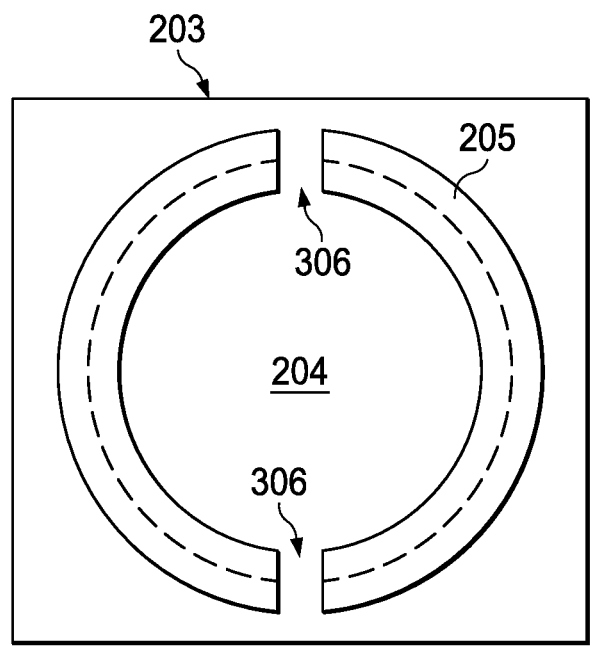
FIG. 3E illustrates a top plan view of a portion of a semiconductor substrate depicting an example patterning of a metal layer for minimizing mechanical stress in an integrated circuit package comprising the semiconductor substrate, the patterning including a plurality of bridges between an inner shape and an outer field, in accordance with embodiments of the present disclosure.

FIG. 3E illustrates a top plan view of a portion of a semiconductor substrate 100 depicting an example patterning of a metallization layer (e.g., top metallization layer 106), the patterning including a plurality (e.g., two) of bridges 306 between inner shape 204 and outer field 203, in accordance with embodiments of the present disclosure. In such an embodiment, a metal pattern may maintain the same overall profile, including keepout distance 202, as shown and described with respect to FIG. 2 above. The patterning shown in FIG. 3E may be useful where different features of the metal pattern are electrically coupled to the same electrical networks (e.g., bridge 306 electrically couples together inner shape 204 and outer field 203 such that inner shape 204 and outer field 203 are of the same electrical node).

Although the patterning depicted in FIGS. 2 and 3A-3E is shown and discussed as being present in top metallization layer 106, it is understood that such patterning may be formed in any other suitable metallization layer. Further, metallization included within such patterning (e.g., in either or both of inner shape 204 and outer field 203) may conduct electrical energy (e.g., signal information in the form of electrical voltage or current, or a supply voltage for operation of integrated circuit devices) or may be electrically inactive. Further, although FIGS. 2 and 3A-3E may depict only a single instance of patterning, multiple instances of patterning may be formed on one or more metallization layers associated with semiconductor substrate 100.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method comprising:
    forming a metal pattern in a metal layer of a fabricated integrated circuit device and under a bump of the fabricated integrated circuit device, wherein the metal pattern has an inner shape and an outer field such that a void space in the metal layer is created between the inner shape and the outer field; and
    approximately centering the void space on an outline of an under-bump metal formed under the bump such that a first distance from the inner shape to the outline is approximately equal to a second distance from the outer field to the outline such that the metal minimizes local variations in mechanical stress on underlying structures within the fabricated integrated circuit device.

2. The method of claim 1, wherein the metal layer is a top-level metal of the fabricated integrated circuit device.

3. The method of claim 1, wherein the metal layer comprises one of copper, a copper alloy, and aluminum.

4. The method of claim 1, wherein the first distance and the second distance are of a sufficient distance such that the metal pattern does not encroach on other bumps adjacent to the bump.

5. The method of claim 1, wherein the outer field has an outer edge such that the outer field maintains the second distance from the under-bump metal outline.

6. The method of claim 1, further comprising forming multiple instances of the metal pattern in the metal layer.

7. The method of claim 1, wherein at least a portion of the metal pattern is electrically active in an integrated circuit of the fabricated integrated circuit device.

8. The method of claim 7, wherein the at least the portion of the metal pattern carries signal information.

9. The method of claim 1, wherein at least a portion of the metal pattern is electrically inactive in an integrated circuit of the fabricated integrated circuit device.

10. The method of claim 1, wherein the metal pattern comprises a linear gap separation through at least one of the inner shape and the outer field.

11. The method of claim 1, wherein the metal pattern comprises a plurality of minor rings co-centric with the inner shape.

12. The method of claim 11, wherein each of the plurality of minor rings are circular in shape.

13. The method of claim 11, wherein each of the plurality of minor rings are polygons.

14. The method of claim 1, wherein the metal pattern has an angle segment comprising a portion of the inner shape and outer field.

15. The method of claim 1, wherein the inner shape is circular in shape.

16. The method of claim 1, wherein the inner shape is polygonal in shape.

17. The method of claim 1, wherein the fabricated integrated circuit device is a wafer-level chip-scale package.

18. The method of claim 1, wherein forming the metal pattern comprises patterning the metal layer in order to create at least one bridge within the metal layer between the inner shape and the outer field such that the inner shape and the outer field are electrically coupled to one another.

19. A fabricated integrated circuit device comprising a metal pattern formed in a metal layer of the fabricated integrated circuit device and under a bump of the fabricated integrated circuit device, wherein:

the metal pattern has an inner shape and an outer field such that a void space in the metal layer is created between the inner shape and the outer field; and the void space is approximately centered on an outline of an under-bump metal formed under the bump such that a first distance from the inner shape to the outline is approximately equal to a second distance from the outer field to the outline such that the metal minimizes local variations in mechanical stress on underlying structures within the fabricated integrated circuit device.

20. The fabricated integrated circuit device of claim 19, wherein the metal layer is a top-level metal of the fabricated integrated circuit device.

21. The fabricated integrated circuit device of claim 19, wherein the metal layer comprises one of copper, a copper alloy, and aluminum.

22. The fabricated integrated circuit device of claim 19, wherein the first distance and the second distance are of a sufficient distance such that the metal pattern does not encroach on other bumps adjacent to the bump.

23. The fabricated integrated circuit device of claim 19, wherein the outer field has an outer edge such that the outer field maintains the second distance from the under-bump metal outline.

24. The fabricated integrated circuit device of claim 19, wherein the fabricated integrated circuit device comprises multiple instances of the metal pattern formed in the metal layer.

25. The fabricated integrated circuit device of claim 19, wherein at least a portion of the metal pattern is electrically active in an integrated circuit of the fabricated integrated circuit device.

26. The fabricated integrated circuit device of claim 25, wherein the at least a portion of the metal pattern carries signal information.

27. The fabricated integrated circuit device of claim 19, wherein at least a portion of the metal pattern is electrically inactive in an integrated circuit of the fabricated integrated circuit device.

28. The fabricated integrated circuit device of claim 19, wherein the metal pattern comprises a linear gap separation through at least one of the inner shape and the outer field.

29. The fabricated integrated circuit device of claim 19, wherein the metal pattern comprises a plurality of minor rings co-centric with the inner shape.

30. The fabricated integrated circuit device of claim 29, wherein each of the plurality of minor rings are circular in shape.

31. The fabricated integrated circuit device of claim 29, wherein each of the plurality of minor rings are polygons.

32. The fabricated integrated circuit device of claim 19, wherein the metal pattern has an angle segment comprising a portion of the inner shape and outer field.

33. The fabricated integrated circuit device of claim 19, wherein the inner shape is circular in shape.

34. The fabricated integrated circuit device of claim 19, wherein the inner shape is polygonal in shape.

35. The fabricated integrated circuit device of claim 19, wherein the fabricated integrated circuit device is a wafer-level chip-scale package.

36. The fabricated integrated circuit device of claim 19, further comprising at least one bridge formed within the metal layer between the inner shape and the outer field such that the inner shape and the outer field are electrically coupled to one another.

* * * * *